United States Patent [19]

Syme et al.

[11] Patent Number: 5,243,198
[45] Date of Patent: Sep. 7, 1993

[54] SEMICONDUCTOR RESONANT TUNNELING DEVICE WITH THICK LAYER

[75] Inventors: Richard T. Syme, Cambridge; Michael J. Kelly, London; Nigel R. Couch, Pinner Green, all of England

[73] Assignee: GEC - Marconi Limited, United Kingdom

[21] Appl. No.: 896,206

[22] Filed: Jun. 10, 1992

[30] Foreign Application Priority Data

Jun. 12, 1991 [GB] United Kingdom ............... 9112605

[51] Int. Cl.$^5$ ............................................. H01L 27/14
[52] U.S. Cl. ..................................... 257/17; 257/184; 257/25; 257/23; 257/21
[58] Field of Search .................. 257/25, 26, 17, 184, 257/185, 21, 23

[56] References Cited

U.S. PATENT DOCUMENTS

| | | | |
|---|---|---|---|
| 4,816,878 | 3/1989 | Kano et al. | 257/25 X |
| 5,017,973 | 5/1991 | Mizuta et al. | 257/25 X |
| 5,079,601 | 1/1992 | Esaki et al. | 257/21 X |
| 5,121,181 | 6/1992 | Smith, III et al. | 257/25 X |

FOREIGN PATENT DOCUMENTS 0237781  2/1990  Japan ................................. 257/21

OTHER PUBLICATIONS

Ting et al., "Large Peak Current Densities in Novel Resonant Interband Tunneling Heterostructures," *Appl. Phys. Lett.* 57(12), Sep. 17, 1990, pp. 1257-1259.

*Primary Examiner*—William Mintel
*Attorney, Agent, or Firm*—Kirschstein, Ottinger, Israel & Schiffmiller

[57] ABSTRACT

A semiconductor radio-frequency power detector comprises, in a stack, an ohmic contact layer, undoped layer of a first semiconductor material, such as GaAs, of thickness $l_1$, an undoped layer of a second semiconductor material, such as AlGaAs, of larger band gap than the first semiconductor material, the thickness of the layer being such that transport in the layer is primarily by intraband tunnelling, a second undoped layer of the first semiconductor material of thickness $l_2$, where $l_2 > 20 l_1$, and a second ohmic contact layer. The difference between the thicknesses of the layers of the first semiconductor material gives rise to asymmetry in the current density/applied voltage characteristic for the device. An n+ layer may be incorporated in the second layer of the intrinsic first material to reduce "band bending" and to increase the current density.

6 Claims, 3 Drawing Sheets

SEMICONDUCTOR RESONANT TUNNELING DEVICE WITH THICK LAYER

BACKGROUND OF THE INVENTION

This invention relates to semiconductor devices, and particularly to devices for detecting radio-frequency power.

SUMMARY OF THE INVENTION

According to the invention there is provided a semiconductor device comprising, in a stack, a first ohmic contact layer; a first undoped layer of thickness $l_1$ of a first semiconductor material; un undoped layer of a second semiconductor material of larger bandgap than said first semiconductor material, the layer being of such thickness that transport therein is primarily by intraband tunnelling; a second undoped layer of thickness $l_2$ of said first semiconductor material where $l_2 > 20 \, l_1$; and a second ohmic contact layer.

Preferably said first semiconductor material is GaAs and said second semiconductor material is AlGaAs.

DESCRIPTION OF THE PREFERRED EMBODIMENTS

Figure 1:
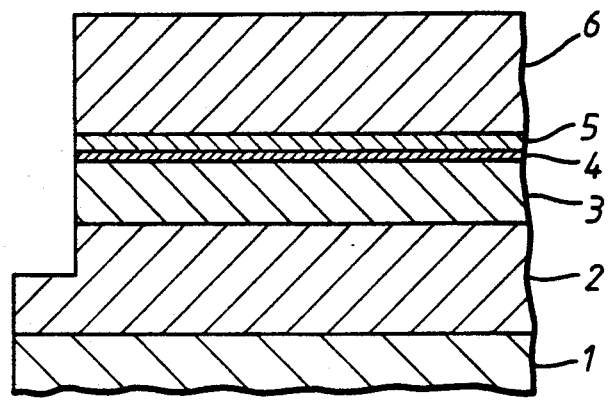
FIGS. 1 and 2 are schematic cross-sectional views of a first configuration and a second configuration, respectively, of semiconductor devices in accordance with the invention.

Referring to FIG. 1 of the drawings, a semiconductor device in accordance with the invention comprises a substrate 1 which may be doped with an n-type material or may be semi-insulating, and is lattice-matched to the material of a layer 2 which is deposited thereon. The layer 2 is formed of a first semiconductor material, which is doped n+-type to form an ohmic contact for connection to a layer 3 formed thereon. The layer 3 is formed of the first semiconductor material but is undoped. The layer 3 has a thickness of $l_1$.

A layer 4 of an undoped second semiconductor material of larger band gap than the first semiconductor material is formed on the layer 3. The conduction band gap offset should be greater than $10k_bT$, where $k_b$ is the Boltzman constand and T=300K. The thickness of the layer 4 is such that the transport therethrough is dominated by intraband tunnelling.

A layer 5 of the undoped first semiconductor material is formed over the layer 4, the thickness of the layer 5 being $l_2$ which is different from the thickness $l_1$ of the other intrinsic first semiconductor material layer 3. Either of the layers may be the thicker; the direction of operation of the device is merely reversed. The ratio of the larger to the smaller of the thickness $l_1$, $l_2$ should preferably be at least 20:1. The sum of $l_1 + l_2$ basically determines the capacitance of the device, and this capacitance, together with the series resistance of the layers, determines the upper limit of the operating frequency of the device.

A layer 6 of the first semiconductor material, doped n+-type, is formed over the layer 5 to provide an ohmic contact to the layer 5.

The edge of each layer is then etched away, down to the layer 2, to enable an electrical connection to be made to the layer.

In the construction of the device of FIG. 1, the first semiconductor material is preferably GaAs and the second semiconductor material is preferably AlGaAs. An example of suitable thicknesses for the layers is then:- layers 2 and 6, 0.5 to 1.0 $\mu$m; the thinner of the layers 3 and 5, 5 to 25 nm; the thicker of the layers 3 and 5, 100 nm to 0.5 $\mu$m. Such device is suitable for operation in the millimetric frequency range.

The above-described diode device may be fabricated as a simple mesa structure by standard semiconductor techniques. Alternatively, other process techniques may be used. Other suitable materials besides GaAs and AlGaAs may also be used.

Figure 2:
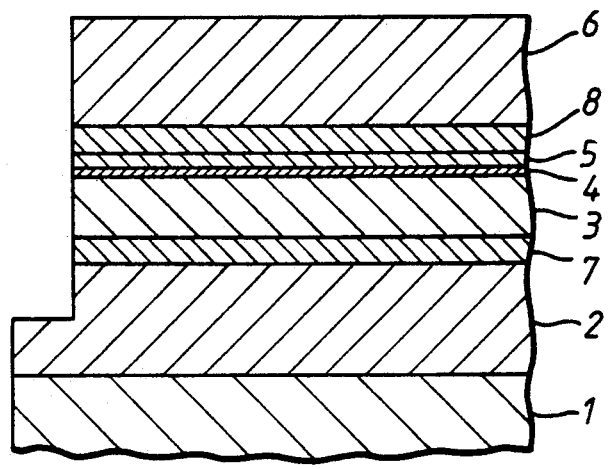

FIG. 2 illustrates, schematically, a second semiconductor device configuration in accordance with the invention. The device has a substrate 1 and layers 2-6 as in the FIG. 1 embodiment, and additionally includes a layer 7 between the layers 2 and 3, and a layer 8 between the layers 5 and 6. The layers 7 and 8 are formed of the first semiconductor material (e.g. GaAs) with n-type doping. The doping density is less than that of the layers 2 and 6, and need not be the same for both of the layers 7 and 8.

The layers 7 and 8 make it possible to determine the current density in the device independently of the doping density required for the ohmic contact layers 2 and 6. The thickness of the layers 7 and 8 may be in a range from zero (i.e., the FIG. 1 embodiment) up to a maximum thickness which is determined by the maximum allowable series resistance to achieve the desired operating frequency. Furthermore, the depletion voltage dropped in the layers 7 and 8 should be much less than the voltage dropped in the layers 3 and 5. For GaAs layers the doping levels for the layers 7 and 8 may be, for example $10^{16}$ to $10^{17}/cm^3$.

In a specific example of a device in accordance with FIG. 2, details of the substrate 1 and the layers 2-8 are as follows:

Substrate 1 formed of GaAs silicon-doped at a density of approximately $3 \times 10^{18}/cm^3$.

Layer 2 formed of GaAs silicon-doped at a density of $3 \times 10^{18}/cm^3$. Thickness 0.5 $\mu$m.

Layer 7 formed of GaAs silicon-doped at a density of $1 \times 10^{17}/cm^3$. Thickness 40 nm.

Layer 3 formed of undoped GaAs. Thickness 200 nm.

Layer 4 formed of undoped AlAs. Thickness 2.85 nm.

Layer 5 formed of undoped GaAs. Thickness 5 nm.

Layer 8 formed of GaAs silicon-doped at a density of $1 \times 10^{17}/cm^3$. Thickness 40 nm.

Layer 6 formed of GaAs silicon-doped at a density of $3 \times 10^{18}/cm^3$. Thickness 0.5 $\mu$m It will be seen that the layers are therefore symmetrical about the central tunnel barrier layer 4, apart from the considerable difference in the thicknesses of the intrinsic GaAs layers 3 and 5.

Figure 3:
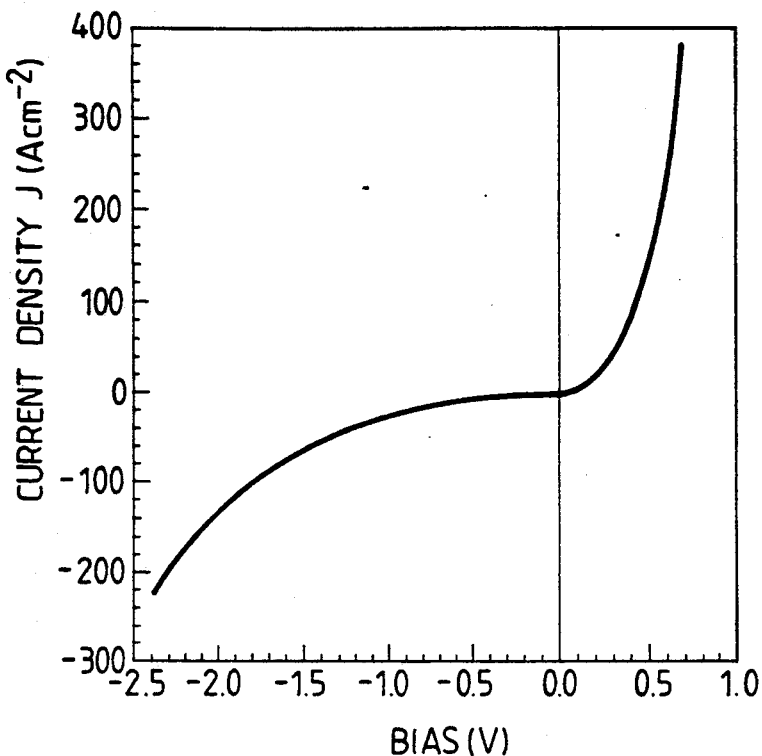
FIGS. 3 and 4 show, respectively, the current/voltage characteristic and the output voltage/input power characteristic of an example of a device in accordance with FIG. 2.
Figure 4:
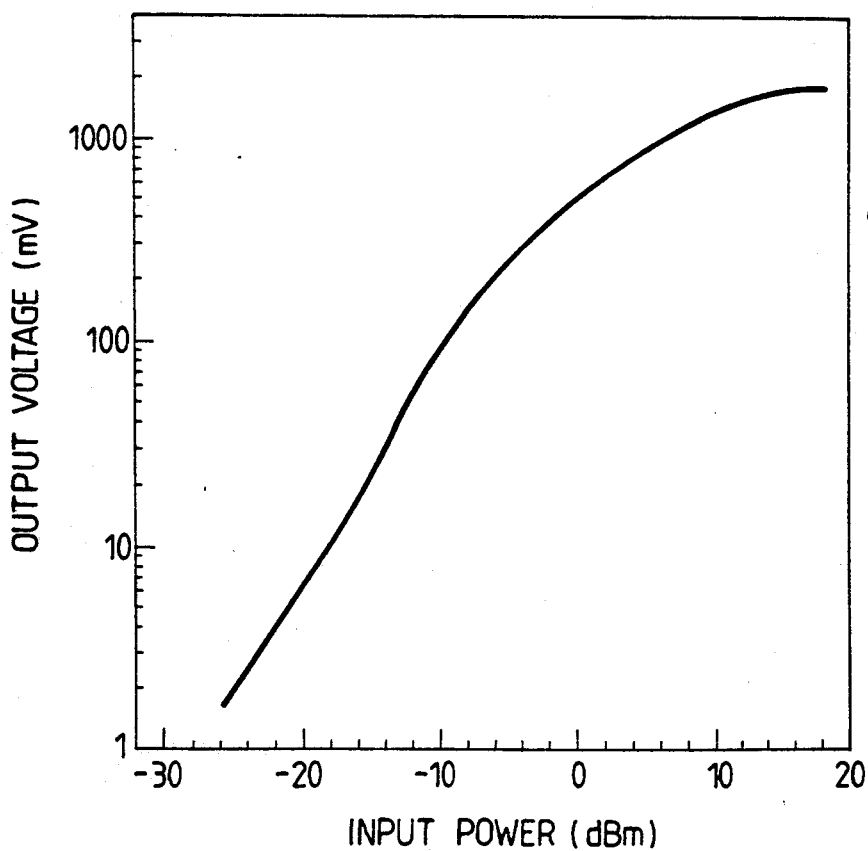

FIG. 3 is a curve of current density J against applied voltage V for the specific device described above, and FIG. 4 is a curve of output voltage in mV against input power, on a dBm scale, for the device. It will be seen that the current density against applied voltage curve of FIG. 3 is asymmetrical about the zero voltage line, so that the device is capable of use as a radio-frequency power detector.

The layer 4 may alternatively be formed of AlGaAs, provided that the aluminum content is such that the conduction band offset is large enough to satisfy the $>10k_bT$ requirement above, which gives an offset of approximately 260 meV, which corresponds to an Al:Ga ratio greater than about 32:68.

Figure 5:
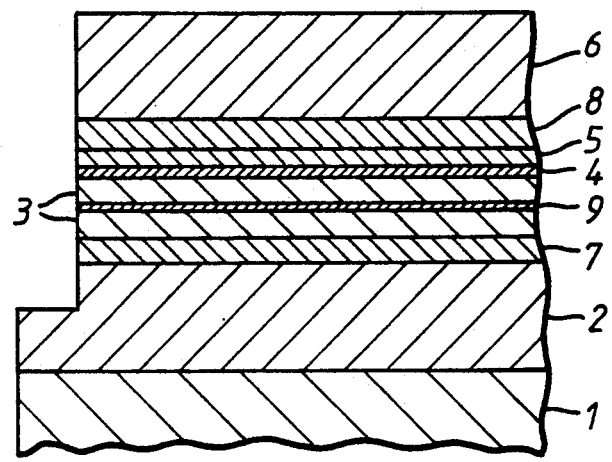
FIG. 5 is a schematic cross-sectional view of a modified version of the device of FIG. 2.

FIG. 5 of the drawings illustrates a further embodiment of the invention. In this case, it is shown as a modification of FIG. 2, but the same modification can be made to the FIG. 1 embodiment. A thin layer 9 (e.g. 50Å-thick) of the first semiconductor material (e.g. GaAs) is introduced into the thicker of the two intrinsic layers 3 and 5 (shown here as the layer 3). The layer 9 is doped n+-type, the doping density being such that the layer 9 will fully deplete under zero or low bias voltage thereacross. The doping density may be, for example, $10^{18}$/cm$^3$. In an alternate embodiment (not shown), a plurality of thin n-doped layers, such as the layer 9, are introduced into a very thick (e.g. 200 nm) intrinsic layer 3 or 5. The thin layers are spaced apart along the intrinsic layer by such distance as will ensure that each thin layer will fully deplete.

The layer 9 (or the plurality of thin layers, as the case may be) reduces the effect of "band bending" as will now be explained.

Figure 6:
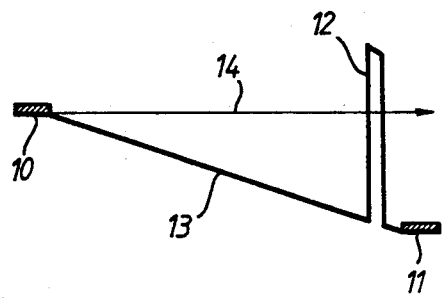
FIGS. 6 and 7 are ideal energy band diagrams for the device of FIG. 2 illustrated on arbitrary axes.
Figure 7:
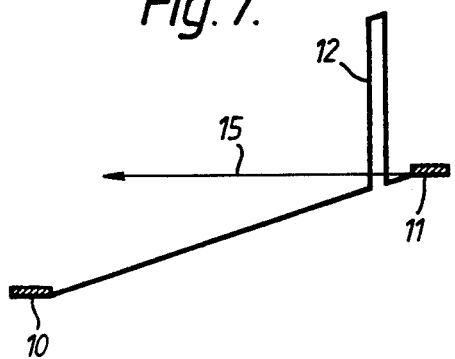

FIGS. 6 and 7 illustrate, schematically, the energy within the device of FIG. 2 when it is biased in the "forward" direction and the "reverse" direction, respectively. The heavily doped contact layers 2 and 6 are represented by contacts 10 and 11, and the thin layer 4 is represented by a narrow, high barrier region 12. A linear voltage drop 13 between the contact 10 and 11 is assumed for the purposes of explanation. For the forward bias condition of FIG. 6 the electrons, flowing in the direction of the arrow 14, have more energy with respect to the bottom of the barrier than in the reverse bias condition of FIG. 7, where they flow in the direction of the arrow 15. In the forward bias condition the electrons can therefore tunnel more easily through the barrier 12 than in the reverse bias condition, so that a higher current density is obtained for the forward bias condition.

Figure 8:
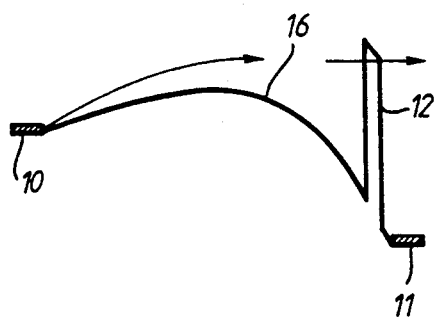
FIGS. 8 and 9 are practical energy band diagrams for the device of FIG. 2 illustrated an arbitrary axes.
Figure 9:
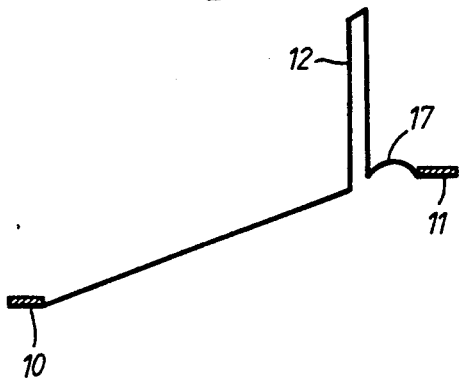

FIGS. 6 and 7 illustrate an ideal condition in which the electron current flow is limited only by the barrier 12. In practice, however, the situation is more complicated than this, as illustrated in FIGS. 8 and 9 for the forward and reverse bias conditions, respectively. Since the contact layers 2 and 6 are heavily doped and the layers 3 and 5 are undoped, there is an additional electrostatic potential barrier present between the contacts 10 and 11 due to "spill-over" effects. The conduction band is, in effect, curved upwards when passing from the heavily-doped contact layer to the undoped layer. This effect is known as "band bending". The curved region 16 in the thicker intrinsic layer is the forward bias condition is shown in FIG. 8, while the curved region 17 in the thinner intrinsic layer in the reverse bias condition is shown in FIG. 9.

For the forward bias condition, there is therefore a substantial electrostatic barrier before the thin high barrier 12 is reached. The electrostatic barrier is too thick for electrons to tunnel through it; they have to pass over the top of it, and then tunnel through the barrier 12. The passage of the electrons over the barrier 16 involves the addition to the current of a thermionic component which is strongly temperature dependent. The magnitude of the current is also reduced, and the desired asymmetry of the current density/voltage curve is impaired.

Figure 10:
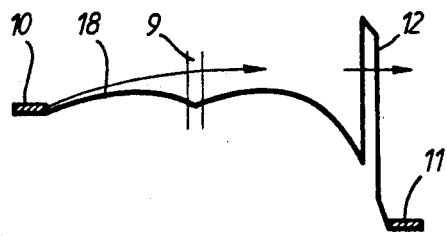
FIG. 10 is a practical energy band diagram for the device of FIG. 5.

The embodiment described above with reference to FIG. 5 helps to overcome these problems. The n+layer 9 incorporated in the thicker intrinsic layer 3 has a doping density multiplied by thickness product such that the layer fully depletes when a voltage is applied across it. The energy band boundary 18 is pulled down at the region of the layer 9, as shown in FIG. 10. The electrostatic barrier is therefore reduced, so that the impedance to electron flow is decreased, and the current density increases. Some small reduction is asymmetry of the current density/voltage characteristic of the device may be caused by inclusion of the layer 9.

As stated above, the thermionic transmission of electrons over the electrostatic barrier is very temperature-dependent. On the other hand, the tunnelling of electrons through the barrier 12 is only slightly temperature-dependent. The reduction in the height of the electrostatic barrier brought about by the incorporation of the n+layer 9 therefore produces a reduction in the temperature dependence of the diode. The incorporation of further n+layers in the layer 5, as proposed above, will achieve further reduction in the height of the electrostatic barrier and thereby allow further increase in the available current density.

The devices in accordance with the invention are therefore useful as radio-frequency (including microwave frequencies) detectors, which are, particularly as regards the FIG. 5 embodiment, only weakly temperature dependent.

Referring back to FIGS. 8 and 9, the asymmetry of the current density/voltage curve is in part due to the fact that electrons will gather in the region 16 in FIG. 8, in a thin (typically 1 to 10 nm) layer, immediately adjacent the barrier 12. Similarly, electrons will gather in the region 17 in FIG. 9, again in a thin (typically 1 to 10 nm) layer, immediately adjacent the barrier 12. The electron concentration in this layer (called an accumulation layer) depends on how far the band has curved down in this layer relative to the position of the band in the contact layer 10 in the case of FIG. 8 and the contact layer 11 in the case of FIG. 9. The further the band has curved down, the more electrons there will be in the accumulation layer. Since the band has curved down more by this point in the case of FIG. 8 than in FIG. 9, there will be more electrons immediately adjacent the barrier in FIG. 8 than in FIG. 9. There will therefore be a larger current in the case of FIG. 8 than for FIG. 9, because more electrons are available to tunnel. An equivalent way of stating this is that the effective chemical potential (i.e. the chemical potential in the accumulation layer relative to the bottom of the barrier) is larger in the case of FIG. 8 than for FIG. 9, again leading to a higher current for the forward bias condition. This effect adds to the overall asymmetry in the current-density/voltage trace. For a given value of $l_1/l_2$, the importance of this effect increases as the value of $(l_1+l_2)$ increases.

We claim:

1. A semiconductor device comprising, in a stack, a first ohmic contact layer; a first undoped layer of thickness $l_1$ of a first semiconductor material; an undoped layer of a second semiconductor material of larger band gap than said first semiconductor material, the undoped layer being of such thickness that transport therein is primarily by intraband tunnelling; a second undoped layer of thickness $l_2$ of said first semiconductor material where $l_2 > 20 \, l_1$; and a second ohmic contact layer.

2. A device as claimed in claim 1, further comprising a first layer of said first semiconductor material doped with n-type material, said first layer being disposed between said first ohmic contact layer and said first undoped layer of said first semiconductor material; and a second layer of said first semiconductor material doped with n-type material, said second layer being disposed between said second ohmic contact layer and said second undoped layer of said first semiconductor material.

3. A device as claimed in claim 1, further comprising at least one third layer of said first semiconductor material doped with n-type material disposed in said second undoped layer of said first semiconductor material, each said third layer being arranged to deplete fully with substantially zero voltage applied thereacross.

4. A device as claimed in claim 1, wherein said first semiconductor material is GaAs.

5. A device as claimed in claim 4, wherein doping material for said doped layers is silicon.

6. A device as claimed in claim 1, wherein said second semiconductor layer is AlGaAs.

* * * * *